United States Patent [19]

Masuda

[11] Patent Number: 4,897,621
[45] Date of Patent: Jan. 30, 1990

[54] OSCILLATOR USING A PIEZO-ELECTRIC DEVICE

[75] Inventor: Youichi Masuda, Yokohama, Japan

[73] Assignee: Kabushiki Kaisha Toshiba, Kanagawa, Japan

[21] Appl. No.: 312,557

[22] Filed: Feb. 21, 1989

[30] Foreign Application Priority Data

Feb. 27, 1988 [JP] Japan .................................. 63-45666

[51] Int. Cl.$^4$ ............................................. H03B 5/32
[52] U.S. Cl. ................................................. 331/107 A
[58] Field of Search ........... 331/107 A, 107 R, 108 B, 331/108 C, 108 R, 155

[56] References Cited

U.S. PATENT DOCUMENTS 4,560,951 12/1985 Fütterer ...................... 331/108 B X
4,581,592 4/1986 Bennett ........................... 331/107 A

FOREIGN PATENT DOCUMENTS 63-27883 6/1988 Japan .
63-85915 6/1988 Japan .

*Primary Examiner*—Eugene R. LaRoche
*Assistant Examiner*—Robert J. Pascal
*Attorney, Agent, or Firm*—Finnegan, Henderson, Farabow, Garrett and Dunner

[57] ABSTRACT

In an oscillator of this invention, a differential amplifier circuit is constituted by connecting the collectors of first and second transistors to one terminal of a DC power source respectively through first and second resistors, the emitters of the first and second transistors to the other terminal of the DC power source through a common current-source, and the bases of the first and second transistors to a bias circuit for applying a bias voltage, at least one port of a piezo-electric device having at least two ports on a single substrate is connected between the collectors of the first and second transistors, and the remaining port is connected between the bases of the first and second transistors. The transistors can be field effect transistors, and the common current-source can be a resistor. In this oscillator, since no DC voltage is applied across transducers of each port, degradation of a piezo-electric device can be prevented. The circuit has a complete symmetrical arrangement, and only a DC current flows in from the power source. For this reason, the circuit does not serve as a noise source for another circuit connected to the power source, and is not easily influenced by noise from the other circuit. Since no large-capacitance capacitor is required, the oscillator is suitable for an integrated circuit.

15 Claims, 7 Drawing Sheets

OSCILLATOR USING A PIEZO-ELECTRIC DEVICE

FIELD OF THE INVENTION AND RELATED ART STATEMENT

The present invention relates to an oscillator using a piezo-electric device.

Conventional television equipment and communication equipment often employ an oscillator using a piezo-electric device such as a surface acoustic wave (SAW) resonator or crystal resonator in a portion requiring a low-noise, highstable frequency source.

FIG. 11 exemplifies a typical Colpitts oscillator using a SAW resonator.

In FIG. 11, reference numeral 51 denotes an oscillating transistor. The base of the transistor 51 is connected to the positive terminal of a DC power source 1 through a resistor 52 and to the negative terminal thereof through a resistor 53. The collector of the transistor 51 is connected to the positive terminal of the power source 1 through a resistor 54, and the emitter is connected to the negative terminal of the power source 1 through a resistor 55. Thus, a DC bias voltage current is supplied to the transistor 51.

A capacitor 58 for bypassing a high-frequency current is connected in parallel with the resistor 55. A capacitor 56 is connected between the base of the transistor 51 and the negative terminal of the power source 1. A capacitor 57 is connected between the collector of the transistor 51 and the negative terminal of the power source 1. These capacitors 56 and 57 match the impedance of a SAW resonator 49 connected in parallel with the base-collector path of the transistor 51 through a capacitor 59 with an impedance of this oscillator, thus causing oscillation.

If the gain of the transistor 51 is sufficiently large, with the above circuit arrangement, the oscillator is oscillated at a resonant frequency of the SAW resonator 49, and a signal having the above-mentioned frequency is outputted from an output terminal 61 connected to the collector of the transistor 51.

Note that in FIG. 11, the capacitor 59 connected in series with the SAW resonator 49 and the resistor 60 connected in parallel therewith are used not to apply a DC voltage to the SAW resonator 49. More specifically, a finger electrode pitch of interdigital transducers 50 of the SAW resonator 49 is as small as several $\mu$m. When an aqueous component of steam or dust becomes attached to the transducers, if a DC voltage is applied across the transducers, the transducers electrically corroded or may be destroyed due to discharging.

In television or communication equipment, in order to reduce the size, weight, and cost, the degree of integration of the circuit is increasing. Thus, an oscillator to be used preferably has a higher degree of integration. However, it is difficult to integrate a piezo-electric resonator such as a SAW resonator on a single substrate together with other circuits. Therefore, integration of an oscillator circuit portion excluding the piezo-electric device has been studied.

However, the circuit shown in FIG. 11 requires four capacitors, and is not suitable for an integrated circuit. This is because in the integrated circuit, capacitors have a larger shape than transistors or resistors.

In particular, in FIG. 11, the capacitance of the capacitor 59 must be sufficiently larger than the transducer capacitance of the SAW resonator 49, i.e., several tens of pF to several hundreds of pF. In addition, the absolute value of the impedance of the capacitor 58 must be sufficiently smaller than the resistance of the resistor 55 at the oscillation frequency. For this purpose, the capacitance of the capacitor 58 must also be several tens of pF to several hundreds of pF. In order to realize such a capacitance on an integrated circuit, an area of 10,000 $\mu$m$^2$ to 1 mm$^2$ is necessary. It is uneconomical to use such an area for one capacitor in an integrated circuit.

In the circuit shown in FIG. 11, a high-frequency current flowing through the collector of the transistor 51 flows through the power source 1 through the resistor 54 and the capacitor 58. If another circuit is connected to the power source 1, the high-frequency current serves as a noise source for the other circuit. In contrast to this, when a noise component from the other circuit enters the line of the power source 1, since the circuit shown in FIG. 11 is of unbalanced type, the noise component enters the circuit through the resistor 52 or 54 or other elements, and as a result, the oscillation frequency is modulated or the noise component appears in the output signal. These influences are conspicuous when the oscillator shown in FIG. 11 and other circuits are mounted on a single integrated circuit substrate.

In this manner, it is very difficult to integrate the conventional oscillator circuit shown in FIG. 11.

OBJECT AND SUMMARY OF THE INVENTION

It is an object of the present invention to provide an oscillator in which a DC voltage is not applied to a piezo-electric device.

It is another object of the present invention to provide an oscillator which does not serve as a noise source for other circuits, and is not easily influenced by the other circuits.

It is still another object of the present invention to provide an oscillator suitable as an integrated circuit.

In the oscillator according to the present invention, the collectors of a pair of transistors are connected to one terminal of a DC power source through resistors, the emitters are connected to the other terminal of the DC power source through a common current-source, and the bases are connected to a bias circuit for applying a bias voltage, thus constituting a differential amplifier circuit. At least one port of a piezo-electric device having at least two ports on a single substrate is connected between the collectors of the transistors, and the remaining port is connected between the bases.

With the above arrangement, in this oscillator, positive feedback is performed through the piezo-electric device from the output of the differential amplifier circuit, i.e., between the collectors of the pair of transistors to the input of the differential amplifier circuit, i.e., between the bases of the pair of transistors at a resonant frequency of the piezo-electric device, thus oscillating the oscillator. As a result, the oscillation output is obtained from the output of the differential amplifier circuit.

In this oscillator, the resistances of the resistors connected to the collectors of the pair of transistors are equal to each other, and the entire circuit serves as a completely balanced arrangement. The pair of transistors perform symmetrical operations in a DC manner, and the DC potentials of the collectors, bases, and emitters are equal to each other in both the transistors. Thus, no DC voltage is applied across the transducers at the port of the piezo-electric device connected between the collectors, and no DC voltage is applied across the transducers at the remaining port connected between the bases. The pair of transistors serve as the differential amplifier circuit. When a current in one transistor is increased, a current in the other transistor is decreased. Thus, the current in the entire circuit is always constant, and no high-frequency current flows through the DC power source upon oscillation.

The transistors may comprise field effect transistors.

In the oscillator using the field effect transistors, the drains of a pair of field effect transistors are connected to one terminal of a DC power source through resistors, the sources are connected to the other terminal of the DC power source through a common current-source, and the gates are connected to a bias circuit for applying a bias voltage, thus constituting a differential amplifier circuit. At least one port of a piezo-electric device having at least two ports on a single substrate is connected between the drains of the field effect transistors, and the remaining port is connected between the gates.

With the above arrangement, in this oscillator, positive feedback is performed through the piezo-electric device, from the output of the differential amplifier circuit, i.e., between the drains of the pair of field effect transistors to the input of the differential amplifier circuit, i.e., between the gates of the pair of field effect transistors at a resonant frequency of the piezo-electric device, thus oscillating the oscillator. As a result, the oscillation output is obtained from the output of the differential amplifier circuit.

In this oscillator, the resistances of the resistors connected to the drains of the pair of field effect transistors are equal to each other, and the entire circuit serves as a completely balanced arrangement. The pair of field effect transistors perform symmetrical operations in a DC manner, and the DC potentials of the drains, gates, and sources are equal to each other in both the field effect transistors. Thus, no DC voltage is applied across the transducers at the port of the piezo-electric device connected between the drains, and no DC voltage is applied across the transducers at the remaining port connected between the gates. The pair of field effect transistors serve as the differential amplifier circuit. When a current in one transistor is increased, the current in the entire circuit is always constant, and no high-frequency current flows through the DC power source upon oscillation.

Furthermore, in these oscillators, the common current-source connected to the emitters or sources may be a resistor means.

As described above, according to the oscillator of the present invention, since no DC voltage is applied across the transducers at the ports of the piezo-electric device having at least two ports, degradation of this piezo-electric device can be prevented. The circuit has a completely symmetrical arrangement, and only a DC current flows from the power source. For this reason, the oscillator does not serve as a noise source for other circuits connected to the power source, and is not easily influenced by noise from the other circuits. In addition, since the oscillator does not require a large-capacitance capacitor, it is very suitable for an integrated circuit.

DETAILED DESCRIPTION OF THE PREFERRED EMBODIMENTS

An embodiment of the present invention will now be described with reference to the accompanying drawings.

Figure 1:
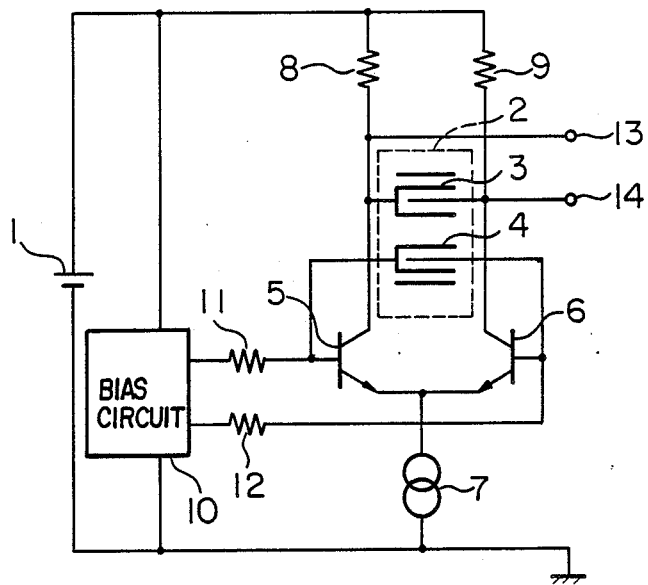
FIG. 1 is a circuit diagram of a first embodiment of the present invention.

FIG. 1 is a circuit diagram showing a first embodiment of the present invention.

In FIG. 1, transistors 5 and 6 are a transistor pair in a differential amplifier. The collectors of the transistors 5 and 6 are connected to one terminal of a DC power source 1 respectively through resistors 8 and 9 having the same resistance. The emitters of the transistors 5 and 6 are connected to the other terminal of the DC power source through a common DC current-source 7. The bases of the transistors 5 and 6 are connected to the output terminals of a bias circuit 10 through resistors 11 and 12 having the same resistance. Note that the bias circuit 10 is powered by the DC power source 1.

A differential amplifier circuit is constituted by the above-mentioned circuit. Port 3 of a 2-port type SAW resonator 2 is connected to the outputs of the differential amplifier circuits, i.e., between the collectors of the transistors 5 and 6, and the other port 4 is connected to the inputs thereof, i.e., between the bases of the transistors 5 and 6.

An AC voltage input across the bases of the transistors 5 and 6 is amplified and outputted from between the collectors. In this case, since the phase of the output AC voltage is inverted, the connecting polarities of the ports 3 and 4 of the 2-port SAW resonator 2 are determined so that voltages generated at the corresponding ports have opposite phases in a resonance state. At a high frequency of several hundreds of MHz, the phase of an output voltage appearing across the collectors of the transistors 5 and 6 is often largely delayed by a time constant defined by the resistors 8 and 9 and the collector-base parasitic capacitance of the transistors 5 and 6 or a transducer capacitance of the 2-port SAW resonator 2. In this case, the connecting polarities of the ports 3 and 4 are determined so that voltages generated at the ports 3 and 4 in a resonance state are in phase with each other, thus allowing easy oscillation. Note that in order to set voltages generated at the ports 3 and 4 from an opposite phase state to an in-phase state or from an in-phase state to an opposite phase state, the connecting polarity of one port need only be inverted. In some cases, the design of the 2-port SAW resonator 2 may be modified, so that the acoustic distance between the ports 3 and 4 can be offset by a ½ wavelength, thus achieving an opposite phase or in-phase state.

The oscillation outputs of this circuit are derived as differential outputs from output terminals 13 and 14 connected to the collectors of the transistors 5 and 6.

Note that a power gain between inputs and outputs of the differential amplifier circuit constituted by the elements excluding the 2-port SAW resonator 2, i.e., a ratio of power input across the bases of the transistors 5 and 6 to power obtained between the collectors, is set to sufficiently compensate for a loss of the 2-port SAW resonator 2. The gain is determined on the basis of the characteristics of the transistors 5 and 6, the current value of the DC current-source 7, the resistances of the resistors 8 and 9, and the like.

In the circuit with the above arrangement shown in FIG. 1, positive feedback is performed from the collectors of the transistors 5 and 6, i.e., the outputs from the differential amplifier circuit to the bases of the transistors 5 and 6, i.e., the inputs of the differential amplifier circuit through the ports 3 and 4 of the 2-port SAW resonator 2, and the circuit is oscillated, thus obtaining oscillation outputs from the output terminals 13 and 14.

An oscillation frequency at this time becomes a frequency lowering the impedance between the ports 3 and 4 of the 2-port SAW resonator 2, i.e., a resonant frequency. Strictly, the oscillation frequency becomes a frequency with which a sum of a change in phase of a voltage transmitted from the port 3 to the port 4 of the 2-port SAW resonator 2 and a change in phase of a voltage transmitted and amplified from the bases of the transistor 5 and 6 to the collectors corresponds to 0° or an integer multiple of 360°. In the 2-port SAW resonator 2, a change in phase of a voltage across the ports is immediately changed by about 180° in a very narrow frequency range having its resonant frequency as the center frequency. Thus, this circuit is oscillated at a frequency within the very narrow frequency range having the resonant frequency as the center frequency and satisfying the above mentioned condition of the sum of changes in phase. As the oscillation frequency is separated from the resonant frequency, an impedance between the ports 3 and 4 is increased and a loss is also increased. Thus, the gain of the differential amplifier circuit must be increased accordingly.

The effect of the embodiment shown in FIG. 1 will be described below. In FIG. 1, the DC potentials of the collectors, bases, and emitters of the transistors 5 and 6 are equal to each other in both the transistors. Thus, no DC voltage is applied to the port 3 of the 2-port SAW resonator 2, which is connected between the collectors. Similarly, no DC voltage is applied to the port 4 connected between the bases. Thus, degradation and destruction of the 2-port SAW resonator 2 can be prevented.

Note that since a DC voltage is applied across the ports 3 and 4, the SAW resonator 2 is designed to have a required port interval.

In the circuit shown in FIG. 1, a power source current flowing from the DC power source 1 is only a current flowing into the bias circuit 10 and a current flowing into the DC current-source 7 through the resistors 8 and 9 and the transistors 5 and 6. Thus, a current flowing through the DC power source 1 is only a DC current, and no high-frequency current at the oscillation frequency flows therethrough. Since the bias circuit 10 supplies only a DC bias voltage to the transistors 5 and 6, only a DC current flows. Since a constant DC current flows through the DC current-source 7, the transistors 5 and 6 perform a differential operation such that if a current in one transistor is increased, a current in the other transistor is decreased. Therefore, the sum of currents flowing through the resistors 8 and 9 is always constant. Thus, if another circuit is connected to the DC power source 1, the circuit shown in FIG. 1 will not serve as a noise source for the circuit. In contrast to this, if a noise component appears in a DC voltage supplied from the DC power source 1, in the circuit shown in FIG. 1, noise components applied to the bases of the transistors 5 and 6 through the bias circuit are in phase with each other. Therefore, these noise components cancel each other by the differential operation, and do not appear in the output voltage across the collectors. This also applies to noise entering through the resistors 8 and 9.

The circuit shown in FIG. 1 is very suitable for an integrated circuit since no capacitor is used.

Figure 2:
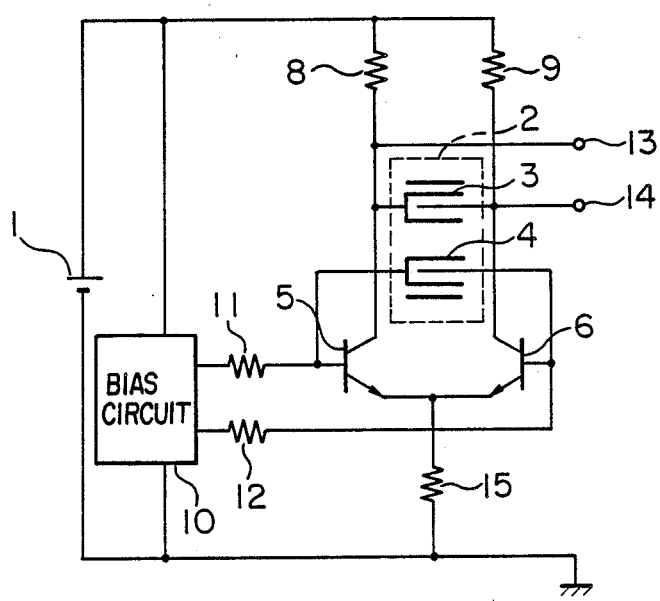
FIG. 2 is a circuit diagram of a second embodiment of the present invention.

FIG. 2 is a circuit diagram of a second embodiment of the present invention.

In the circuit of this embodiment, a resistor 15 serving as a constant current-source is connected between the connecting node between the emitters of transistors 5 and 6 and one terminal of a DC power source. With this connection, since the transistors 5 and 6 serve as a differential pair, substantially the same effect as in the first embodiment can be obtained.

Figure 3:
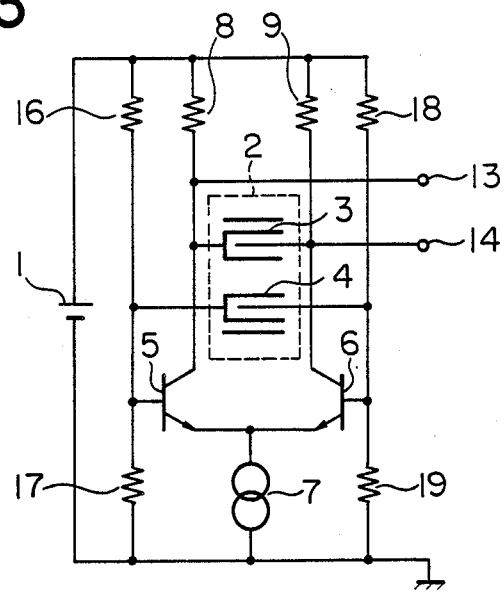
FIG. 3 is a circuit diagram of a third embodiment of the present invention.

FIG. 3 is a circuit diagram of a third embodiment in which a bias circuit is constituted by only resistors and which can be very easily realized.

In this embodiment, a voltage from a DC power source 1 is voltage-divided by resistors 16 and 17 to apply a bias voltage to the base of a transistor 5. Similarly, the voltage from the DC power source 1 is voltage-divided by resistors 18 and 19 to apply a bias voltage to the base of a transistor 6. In this case, the resistances of the resistors 16 and 18 and the resistances of the resistors 17 and 19 are respectively equal to each other.

Figure 4:
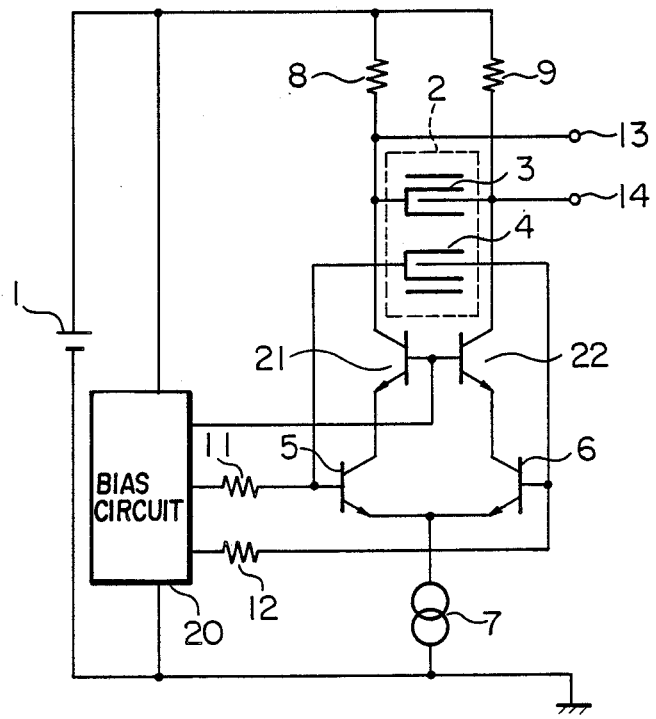
FIG. 4 is a circuit diagram of a fourth embodiment of the present invention.

FIG. 4 is a circuit diagram of a fourth embodiment suitable for high-frequency use.

In this embodiment, the collector-emitter path of a transistor 21 is connected in series with the collector of a transistor 5, and the collector-emitter path of a transistor 22 is connected in series with the collector of a transistor 6. A common bias voltage is applied from a bias circuit 20 to the bases of the transistors 21 and 22. With this connection, the circuit of this embodiment can be used at a higher frequency than the embodiment shown in FIG. 1.

In FIG. 4, the collector potentials of the transistors 5 and 6 are fixed to be a value obtained by subtracting a base-emitter voltage (about 0.7 V) of the transistors 21 and 22 from the voltage applied from the bias circuit 20 to the bases of the transistors 21 and 22, and are almost constant even if the circuit is in an oscillation state. For this reason, a problem at a high frequency, i.e., a phenomenon wherein a collector AC voltage is negatively fed back to the bases due to the collector-base parasitic capacitances of the transistors 5 and 6 to equivalently reduce the gains of the transistors 5 and 6, can be effectively eliminated.

Other circuit operations are substantially the same as those in the circuit shown in FIG. 1, except that the collector currents of the transistors 5 and 6 flow through the transistors 21 and 22.

Figure 5:
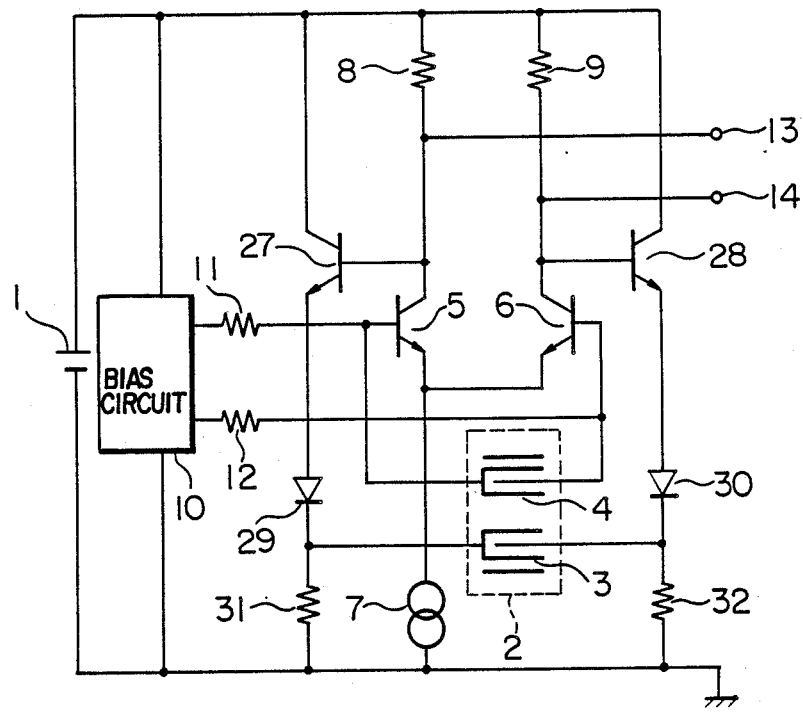
FIG. 5 is a circuit diagram of a fifth embodiment of the present invention.

FIG. 5 is a circuit diagram of a fifth embodiment.

In this embodiment, not only is no DC voltage is applied across either the transducers at one port 3 of a 2-port SAW resonator 2 or the transducers at the other port 4, but also no DC voltage is applied across the ports 3 and 4.

In FIG. 5, the base of a transistor 27, the collector of which is connected to one terminal of a DC power source 1, is connected to the collector of a transistor 5. The emitter of the transistor 27 is connected to the other terminal of the DC power source 1 through a diode 29 and a resistor 31. Similarly, the base of a transistor 28, the collector of which is connected to one terminal of the DC power source 1, is connected to the collector of a transistor 6. The emitter of the transistor 28 is connected to the other terminal of the DC power source 1 through a diode 30 and a resistor 32. The port 3 of the 2-port SAW resonator 2 is connected not between the collectors of the transistors 5 and 6 but between the connecting node between the diode 29 and the resistor 31 and the connecting node between the diode 30 and the resistor 32.

In this circuit, the DC bias voltage value of the collector-base path of each of the transistors 5 and 6, which is determined by a voltage applied from a bias circuit 10 to the bases of the transistors 5 and 6, the resistances of resistors 8 and 9, and the current value of a DC current-source 7, is designed to be equal to a sum voltage value of the base-emitter voltage of each of the transistors 27 and 28 and the voltage across the two terminals of each of the diodes 29 and 30. More specifically, the DC potential of the port 3 of the 2-port SAW resonator 2 is equal to the DC potential of the port 4.

According to this embodiment, not only is no DC voltage applied across either the transducers at the port 3 of the 2-port SAW resonator 2 or the transducers at the port 4, but also no DC voltage is applied across the ports 3 and 4. Note that in FIG. 5, output terminals 13 and 14 are connected to the collectors of the transistors 5 and 6 but may be connected to the emitters of the transistors 27 and 28 or to the two terminals of the port 3.

Figure 6:
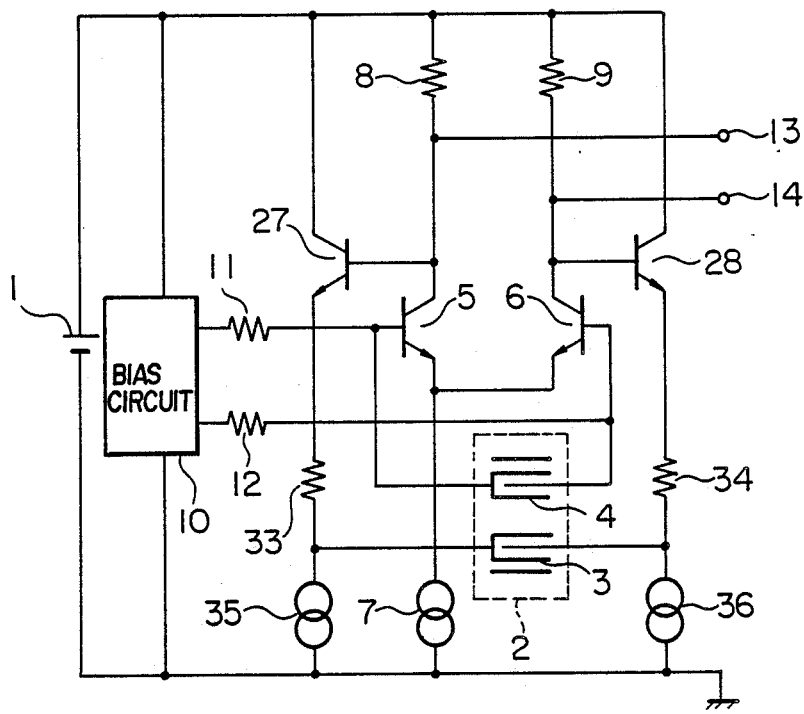
FIG. 6 is a circuit diagram of a sixth embodiment of the present invention.

FIG. 6 is a circuit diagram of a sixth embodiment having the same object as in the embodiment shown in FIG. 5.

In this embodiment, the diodes 29 and 30 shown in FIG. 5 are replaced with resistors 33 and 34, respectively, and the resistors 31 and 32 are replaced with DC current-sources 35 and 36, respectively.

In the circuit shown in FIG. 6, the collector-base DC bias voltage value of each of transistors 5 and 6 is designed to be equal to a sum voltage value of the base-emitter voltage of each of the transistors 27 and 28 and a voltage across two terminals of each of the resistors 33 and 34. Note that the voltage across the two terminals of each of the resistors 33 and 34 is determined by the resistances of the resistors 33 and 34 and the current values of the DC current-sources 35 and 36.

According to the above-mentioned arrangement and design, the DC potential of the port 3 of the 2-port SAW resonator 2 is equal to the DC potential of the port 4.

According to this embodiment, not only is no DC voltage applied across either the transducers at one port 3 of a 2-port SAW resonator 2 or the transducers at the other port 4, but also no DC voltage is applied across the ports 3 and 4.

Note that in FIG. 6, output terminals 13 and 14 are connected to the collectors of the transistors 5 and 6 but may be connected to the emitters of the transistors 27 and 28 or to the two terminals of the port 3.

The diodes 29 and 30 shown in FIG. 5 and the resistors 33 and 34 shown in FIG. 6 can be omitted. In this case, the collector-base bias voltage of each of the transistors 5 and 6 is set to be equal to the base-emitter voltage of each of the transistors 27 and 28, i.e., about 0.7 V.

Figure 7:
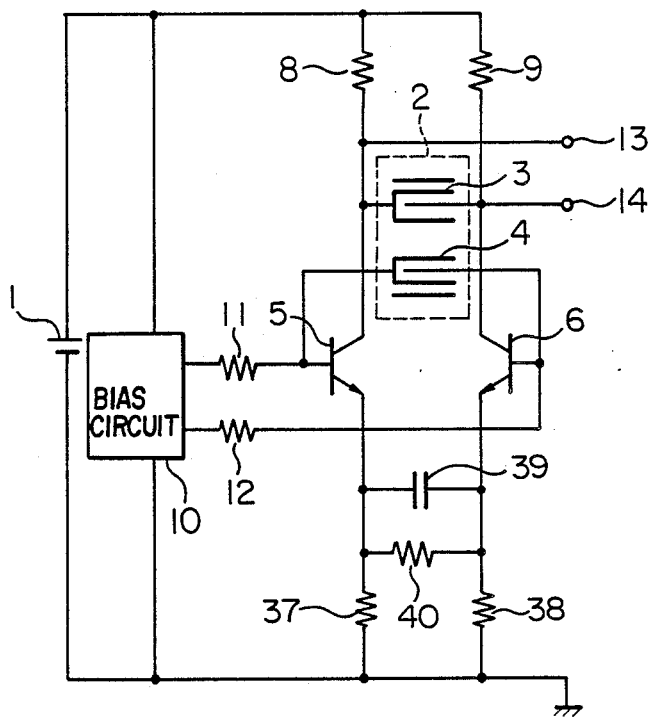
FIG. 7 is a circuit diagram of a seventh embodiment of the present invention.

FIG. 7 is a circuit diagram of a seventh embodiment of the present invention.

In this embodiment, the emitters of transistors 5 and 6 are connected not to a DC current-source but to one terminal of a DC power source 1 respectively through resistors 37 and 38. A capacitor 39 and a resistor 40 are connected between the emitters of the transistors 5 and 6. The capacitance of the capacitor 39 is selected so that the absolute value of its impedance is sufficiently smaller than the resistance of the resistor 40 at the resonant frequency of a 2-port SAW resonator 2.

With this arrangement, at the resonant frequency of the 2-port SAW resonator 2, since the impedance of the capacitor 39 is sufficiently small, the circuit shown in FIG. 7 is substantially equivalent to the circuit shown in FIG. 2, and is oscillated. At a low frequency, since the impedance of the capacitor 39 is increased, the gain of the differential amplifier constituted by the transistors 5 and 6 is decreased, and unnecessary oscillation can be prevented. Note that the "unnecessary oscillation" includes oscillation at a frequency other than the resonant frequency caused by spurious oscillation, equivalent parallel capacitance, and the like of the 2-port SAW resonator.

In the circuit of FIG. 7, since the capacitance of the capacitor 39 is reduced, the 2-port SAW resonator can be oscillated at a frequency of the harmonic of the second order, third order, or the like.

In the above embodiments, the transistors 5 and 6 comprise bipolar transistors. However, the present invention is no limited to this. For example, the transistors 5 and 6 may comprise field effect transistors.

Figure 8:
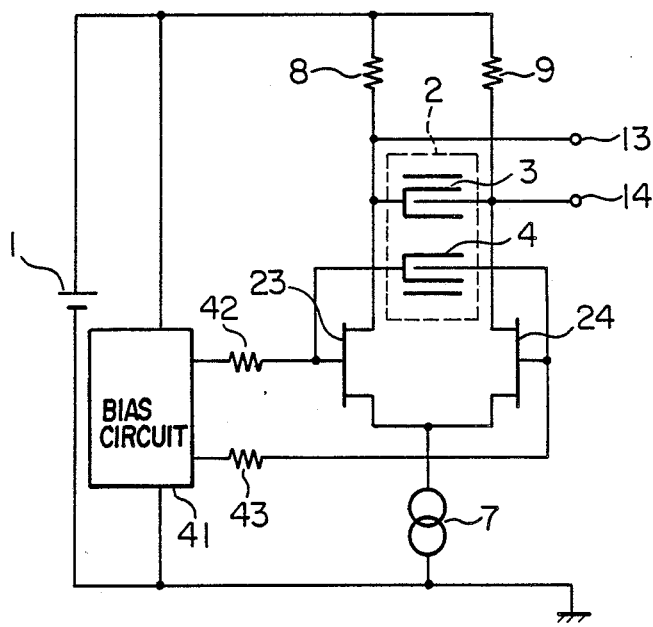
FIG. 8 is a circuit diagram of an eighth embodiment of the present invention.

FIG. 8 is a circuit diagram of an eighth embodiment using field effect transistors. In this embodiment, field effect transistors 23 and 24 are connected in place of the bipolar transistors.

For the resonator, the present invention is not limited to the SAW resonator but may be a piezo-electric device such as a SAW filter, a SAW delay line, a crystal resonator, or the like.

Figure 9:
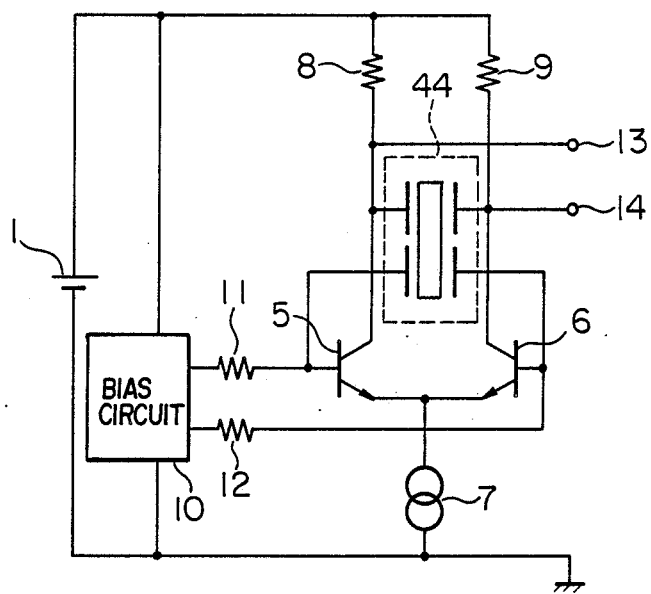
FIG. 9 is a circuit diagram of a ninth embodiment of the present invention.

FIG. 9 is a circuit diagram of a ninth embodiment using a 2-port crystal resonator. In place of the 2-port SAW resonator, a 2-port crystal resonator 44 is connected.

In the above embodiments, the resonator having two ports has been described. However, the present invention is not limited to this. More specifically, the resonator may have not only two ports but also three or more ports.

When a SAW resonator having three or more ports is used in the oscillator of the present invention, one or a plurality of ports are connected in parallel or series with each other, and the remaining ports are similarly connected in parallel or series with each other. The above-mentioned connecting method also applies to a case wherein a multitransducer SAW filter or SAW delay line is used.

The circuit arrangement of a tenth embodiment wherein a SAW resonator having three ports is used in an oscillator circuit will be described below with reference to FIG. 10.

Figure 10:
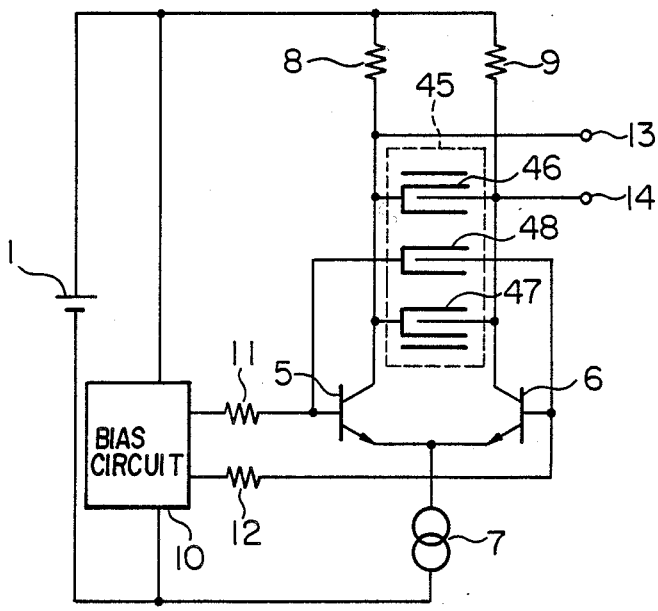
FIG. 10 is a circuit diagram of a tenth embodiment of the present invention.
Figure 11:
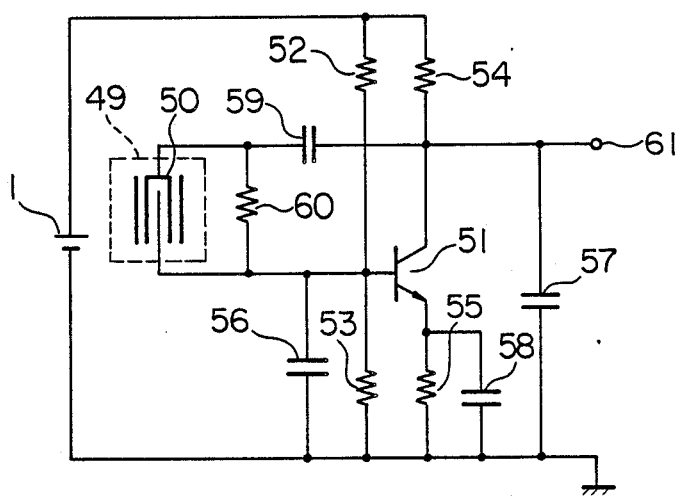
FIG. 11 is a circuit diagram of a conventional circuit.

In FIG. 10, a parallel circuit of ports 46 and 47 of SAW resonator 45 is connected between the collectors of transistors 5 and 6. A port 48 is connected between the bases of the transistors 5 and 6. With the above connection, the same operations and effects as those in the embodiment shown in FIG. 1 can be obtained.

Meanwhile, a parallel circuit of two ports of SAW resonator having five ports is connected between the collectors, and the remaining three ports can be connected between the bases.

In the above-mentioned embodiments, the oscillation frequency can be finely adjusted.

For example, in the embodiment shown in FIG. 1, a capacitor is connected between the collectors or bases of the transistors 5 and 6, or between the collector of the transistor 5 and one terminal of the DC power source 1 and between the collector of the transistor 6 and one terminal of the DC power source 1, or between the base of the transistor 5 and one terminal of the DC power source 1 and between the base of the transistor 6 and one terminal of the DC power source 1, so that the oscillation frequency is finely adjusted on the basis of the capacitance of the capacitor. This also applies to other embodiments.

In the above embodiments, the output terminals are connected to the outputs of the differential amplifier circuit, but may be connected to the inputs of the differential amplifier circuit. More specifically, the outputs can be obtained from two terminals of any port of the piezo-electric device.

The specific embodiments of the present invention have been described. However, various other changes and modifications of the present invention may be made within the spirit and scope of the invention. Some of the above embodiments may be combined.

What is claimed is:

1. An oscillator using a piezo-electric device wherein a differential amplifier circuit is constituted by connecting collectors of first and second transistors to one terminal of a DC power source respectively through first and second resistors, emitters of said first and second transistors to the other terminal of said DC power source through a common first current-source, and bases of said first and second transistors to a bias circuit for applying a bias voltage, at least one port of a piezo-electric device having at least two ports on a single substrate is connected between said collectors of said first and second transistors, and the remaining port is connected between said bases of said first and second transistors.

2. An oscillator using a piezo-electric device according to claim 1, wherein said piezo-electric device comprises a surface acoustic wave resonator.

3. An oscillator using a piezo-electric device according to claim 1, wherein said piezo-electric device comprises a crystal resonator.

4. An oscillator using a piezo-electric device according to claim 2, wherein said piezo-electric device has two ports.

5. An oscillator using a piezo-electric device according to claim 1, wherein said piezo-electric device has three ports.

6. An oscillator using a piezo-electric device according to claim 1, wherein said bias circuit is constituted by resistors.

7. An oscillator using a piezo-electric device according to claim 1, wherein emitters of third and fourth transistors are connected to said collectors of said first and second transistors, collectors of said third and fourth transistors are connected to said at least one port of said piezo-electric device, and bases of said third and fourth transistors are connected to said bias circuit.

8. An oscillator using a piezo-electric device according to claim 7, wherein said collector of said third transistor is connected to said DC power source through said first resistor, and said collector of said fourth transistor is connected to said DC power source through said second resistor.

9. An oscillator using a piezo-electric device according to claim 1, wherein a collector of a third transistor is connected to the one terminal of said DC power source, an emitter of said third transistor is connected to the other terminal of said DC power source through a first diode and a third resistor, a base of said third transistor is connected to said collector of said first transistor, a collector of a fourth transistor is connected to the one terminal of said DC power source, an emitter of said fourth transistor is connected to the other terminal of said DC power source through a second diode and a fourth resistor, a base of said fourth transistor is connected to said collector of said second transistor, and said at least one port of said piezo-electric device is connected between a connecting node between said first diode and said third resistor and a connecting node between said second diode and said fourth resistor.

10. An oscillator using a piezo-electric device according to claim 1, wherein a collector of a third transistor is connected to the one terminal of said DC power source, an emitter of said third transistor is connected to the other terminal of said DC power source through a third resistor and a second current-source, a base of said third transistor is connected to said collector of said first transistor, a collector of a fourth transistor is connected to the one terminal of said DC power source, an emitter of said fourth transistor is connected to the other terminal of said DC power source through a fourth resistor and said third current-source, a base of said fourth transistor is connected to said collector of said second transistor, and said at least one port of said piezo-electric device is connected to a connecting node between said third current-source and said fourth resistor.

11. An oscillator using a piezo-electric device wherein a differential amplifier circuit is constituted by connecting collectors of first and second transistors to one terminal of a DC power source respectively through first and second resistors, emitters of said first and second transistors to the other terminal of said DC power source through common resistor means, and bases of said first and second transistors to a bias circuit for applying a bias voltage, at least one port of a piezo-electric device having at least two ports on a single substrate is connected between said collectors of said first and second transistors, and the remaining port is connected between said bases of said first and second transistors.

12. An oscillator using a piezo-electric device according to claim 11, wherein said resistor means comprises a resistor.

13. An oscillator using a piezo-electric device according to claim 11, wherein said resistor means comprises a parallel circuit of a capacitor and a third resistor connected between said emitters of said first and second transistors, and a series circuit of fourth and fifth resistors connected between said emitters and said DC power source.

14. An oscillator using a piezo-electric device wherein a differential amplifier circuit is constituted by connecting drains of first and second field effect transistors to one terminal of a DC power source respectively through first and second resistors, sources of said first and second field effect transistors to the other terminal of said DC power source through a common first current-source, and gates of said first and second field effect transistors to a bias circuit for applying a bias voltage, at least one port of a piezo-electric device having at least two ports on a single substrate is connected between said drains of said first and second field effect transistors, and the remaining port is connected between said gates of said first and second field effect transistors.

15. An oscillator using a piezo-electric device wherein a differential amplifier circuit is constituted by connecting drains of first and second field effect transistors to one terminal of a DC power source respectively through first and second resistors, sources of said first and second field effect transistors to the other terminal of said DC power source through common resistor means, and gates of said first and second field effect transistors to a bias circuit for applying a bias voltage, at least one port of a piezo-electric device having at least two ports on a single substrate is connected between said drains of said first and second field effect transistors, and the remaining port is connected between said gates of said first and second field effect transistors.

* * * * *